(12) United States Patent
Lien

(10) Patent No.: US 11,778,740 B2
(45) Date of Patent: Oct. 3, 2023

(54) STRUCTURE OF MEMORY MODULE AND MODIFICATION METHOD OF MEMORY MODULE

(71) Applicant: Shih-Hsiung Lien, Taipei (TW)

(72) Inventor: Shih-Hsiung Lien, Taipei (TW)

(*) Notice: Subject to any disclaimer, the term of this patent is extended or adjusted under 35 U.S.C. 154(b) by 227 days.

(21) Appl. No.: 17/475,974

(22) Filed: Sep. 15, 2021

(65) Prior Publication Data

US 2022/0087019 A1   Mar. 17, 2022

(30) Foreign Application Priority Data

Sep. 16, 2020  (TW) .................................. 109131898
May 19, 2021  (TW) .................................. 110205718

(51) Int. Cl.
H05K 1/11 (2006.01)
H05K 1/02 (2006.01)

(52) U.S. Cl.
CPC ........... *H05K 1/111* (2013.01); *H05K 1/0203* (2013.01); *H05K 2201/10159* (2013.01)

(58) Field of Classification Search
CPC .............. H05K 1/111; H05K 1/0203; H05K 2201/10159; H05K 2201/10204; H05K 2203/173; H05K 2203/176; H05K 1/0286
See application file for complete search history.

(56) References Cited

U.S. PATENT DOCUMENTS

| | | | | |
|---|---|---|---|---|
| 4,885,841 A | * | 12/1989 | McNabb | H05K 13/046 29/841 |
| 2003/0214049 A1 | * | 11/2003 | Hortaleza | H01L 23/49816 257/737 |
| 2003/0222668 A1 | * | 12/2003 | Hung | G01R 3/00 205/112 |
| 2006/0267172 A1 | * | 11/2006 | Nguyen | G11C 8/12 257/681 |
| 2018/0337116 A1 | * | 11/2018 | Lin | H01L 23/3114 |

* cited by examiner

*Primary Examiner* — Sherman Ng
(74) *Attorney, Agent, or Firm* — MUNCY, GEISSLER, OLDS & LOWE, P.C.

(57) ABSTRACT

An improved memory module structure includes a printed circuit board, memory units disposed on the printed circuit board, and a connection interface disposed on the printed circuit board for connection with an electronic device. The printed circuit board includes a solder pad zone having solder pads electrically connected with the memory units and the connection interface. A conduction element is combined with the solder pad zone or at least one conductor line electrically connected, in the form of bridge connection, the solder pads, in order to have the solder pads electrically connected. A memory module modification method is also provided, including removing a register from an existing dual inline memory module to expose a solder pad zone, and disposing of a conduction element or arranging a conductor line to have the memory units and the connection interface of electrically connected to thereby form an improved memory module structure.

10 Claims, 8 Drawing Sheets

STRUCTURE OF MEMORY MODULE AND MODIFICATION METHOD OF MEMORY MODULE

CROSS-REFERENCE TO RELATED APPLICATION

The application claims the priority of Taiwan Patent Application Nos. 109131898 and 110205718, which were filed on Sep. 16, 2020 and May 19, 2021, respectively.

FIELD OF THE INVENTION

The present invention relates to a technical field concerning memory modules and modification methods thereof, and more particular to an improved memory module structure that enhances modification thereof and a memory module modification method that modifies a dual-inline memory module with a register into an improved memory module structure.

BACKGROUND OF THE INVENTION

The up-to-date development of integrated circuits makes it necessary to include a memory module in an electronic device in order to store or temporarily hold and cache digital data. Various memory modules that are currently available are generally classified as unbuffered dual inline memory module (UDIMM), registered dual inline memory module (RDIMM), small outline dual inline memory module (SODIMM), and load reduced DIMM (LRDIMM).

Among these memory modules, UDIMMs are generally used in desktop computers, while RDIMMs are used in workstations and servers. The RDIMM includes additionally a register, as compared to UDIMM, making the two different from each other in structure. As shown in FIG. 8, an RDIMM 20 includes a printed circuit board 21, multiple memory units 22, a register 23, and a connection interface 24, wherein register 23 is in electrical connection with the memory units 22 and the connection interface 24. However, with the development of the market, there is sometimes an issue of surplus supply of RDIMMs, and as such, the manufacturers or the suppliers were intending to modify and convert RDIMMs, FBDIMMs, or LRDIMMS into UDIMMS or SODIMMs. However, removing the register, or a buffer or an isolation memory buffer (IMB) causes loss of electrical connection between the memory units 22 and the connection interface 24 of the printed circuit board 21. Consequently, the memory units 22 must be also removed and re-arranged in a different form in order to establish the electrical connection of the memory units 22 and the connection interface 24 on a printed circuit board 21, and as such the modification and conversion of RDIMMs, FBDIMMs, or LRDIMMS into UDIMMs or SODIMMs can be successfully done.

However, an operation of modification, if implemented as noted above, would make it necessary for a manufacturer or a supplier to spend a lot of operation time for the removing and re-mounting job. In addition, the printed circuit board is not shareable between the two and this inevitably leads to an increase in cost and a waste of resources.

However, in view of the above, the present invention aims to an improved memory module structure and a memory module modification method, which help alleviate or even overcome the above-discussed technical shortcoming and thus enhance industrial utilization.

SUMMARY OF THE INVENTION

The primary objective of the present invention is to provide an improved memory module structure and a memory module modification method, which help alleviate and overcome the problems discussed above, in which a conduction element or a conductor line is used to electrically connect solder pads for electrically connecting the memory units and the connection interface, so that the operation and time that a manufacturer or a distributor must take to modify and convert a register-included dual inline memory module into the improved structure can be saved, and also, there is no need to provide an additional, new printed circuit board and to dispose of an existing printed circuit board of the register-included dual inline memory module to thereby eliminating waste of resources.

Thus, to achieve the above objective, the present invention provides an improved memory module structure, which comprises: a printed circuit board; a plurality of memory units, the memory units being disposed on the printed circuit board; and a connection interface, which is disposed on the printed circuit board for connection with a host system of an electronic device; wherein the printed circuit board comprises a solder pad zone that is in electrical connection with the memory units and the connection interface, and the solder pad zone comprises a plurality of solder pads, and wherein a conduction element is combined with the solder pad zone, such that the solder pads are electrically connected by means of the conduction element.

In the improved memory module structure provided above, the conduction element comprises a substrate on which a conduction wiring layer is formed, and the substrate has an undersurface on which a plurality of connection members are provided and respectively corresponding to the solder pads.

In the improved memory module structure provided above, the conduction element comprises an encapsulation layer arranged on the substrate.

In the improved memory module structure provided above, the substrate and the encapsulation layer are not provided with a chip therebetween.

In the improved memory module structure provided above, the substrate and the encapsulation layer are provided with a chip therebetween, and the chip is of no function at all.

In the improved memory module structure provided above, an ink layer is coated on the surface of the substrate of the conduction element.

In the improved memory module structure provided above, a heat dissipation device is arranged on the substrate of the conduction element.

In the improved memory module structure provided above, at least one passive element is arranged on the substrate of the conduction element.

In the improved memory module structure provided above, the passive element comprises an electrical resistor, an electrical capacitor, or an electrical inductor.

In the improved memory module structure provided above, the conduction element comprises an electrical connector, an electrical switch, or an electrical relay.

Further, the present invention also provides an improved memory module structure, which comprises: a printed circuit board; a plurality of memory units, the memory units being disposed on the printed circuit board; and a connection interface, which is disposed on the printed circuit board for connection with a host system of an electronic device; wherein the printed circuit board comprises a solder pad zone that is in electrical connection with the memory units and the connection interface, and the solder pad zone comprises a plurality of solder pads, and wherein at least one conductor line is arranged to electrically connect, in the form of bridge connection, the solder pads.

In the improved memory module structure provided above, the conductor line is covered with an encapsulation layer.

Further, the present invention provides a memory module modification method, which is applicable to modify and convert a register-included dual inline memory module into an improved memory module structure, the method comprising: removing a register from the register-included dual inline memory module in order to expose a solder pad zone provided on a printed circuit board of the register-included dual inline memory module, disposing of a conduction element on the solder pad zone so as to have memory units and a connection interface of the register-included dual inline memory module electrically connected by means of the conduction element to form the improved memory module structure.

In addition, the present invention further provides a memory module modification method, which is applicable to modify and convert a register-included dual inline memory module into an improved memory module structure, the method comprising: removing a register from the register-included dual inline memory module in order to expose a solder pad zone provided on a printed circuit board of the register-included dual inline memory module, arranging at least one conductor line to electrically connect, in the form of bridge connection, solder pads of the solder pad zone to have memory units and a connection interface of the register-included dual inline memory module electrically connected to form the improved memory module structure.

In the memory module modification method provided above, after the formation of the improved memory module structure, an encapsulation layer is set to cover the conductor line.

DETAILED DESCRIPTION OF THE PREFERRED EMBODIMENTS

Embodiments of the present invention will be described below with reference to FIGS. 1-8. The description is not intended to impose undue constraints to the ways of embodying the present invention, and is rather provided as one way of embodying the present invention.

Figure 1:
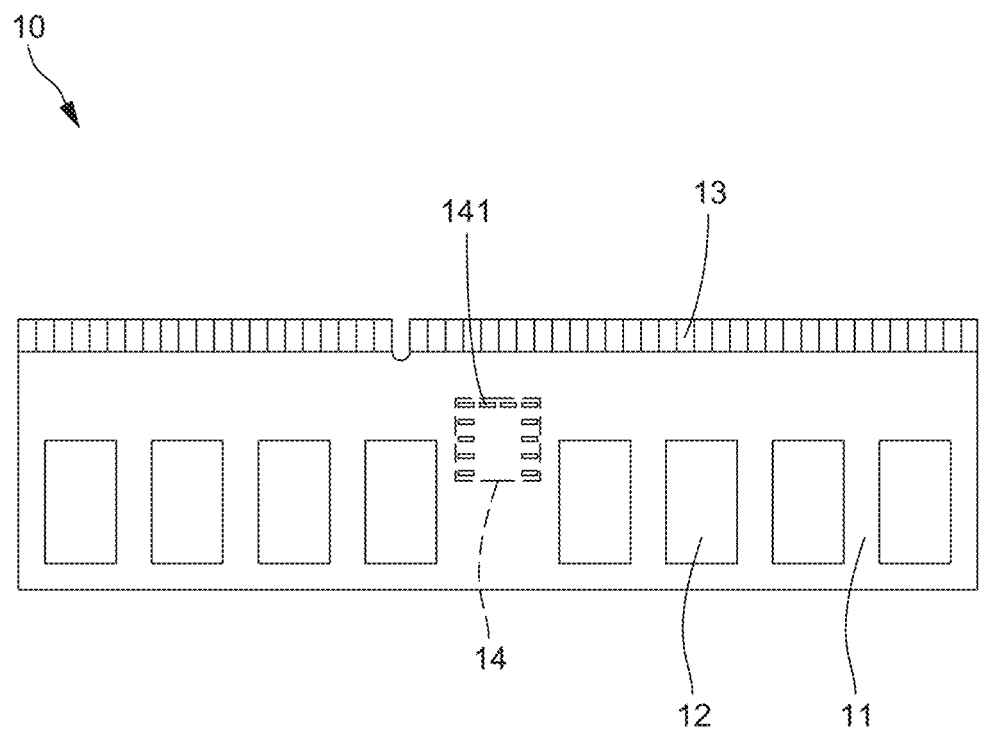
FIG. 1 is a plan view schematically showing an improved memory module structure according to the present invention.
Figure 2:
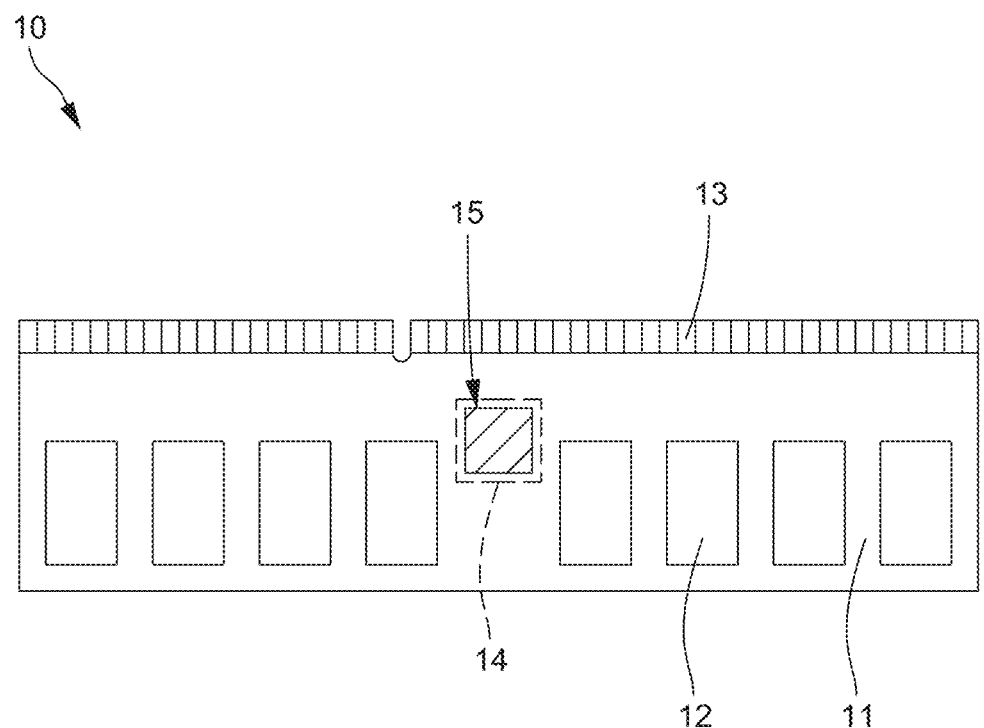
FIG. 2 is another plan view schematically showing the improved memory module structure according to the present invention.

Firstly, referring simultaneously to FIGS. 1 and 2, the present invention provides an improved memory module structure 10, which comprises: a printed circuit board 11; a plurality of memory units 12, the memory units 12 being disposed on the printed circuit board 11; and a connection interface 13, which is disposed on the printed circuit board 11 for connection with a host system of an electronic device (not shown). The printed circuit board 11 is provided with a solder pad zone 14 that is in electrical connection with the memory units 12 and the connection interface 13. The solder pad zone 14 includes a plurality of solder pads 141. A conduction element 15 is combinable with the solder pad zone 14, so as to have the solder pads 141 electrically connected by means of the conduction element 15. Thus, the memory units 12 and the connection interface 13 that are disposed on the printed circuit board 11 are electrically connected.

The connection interface 13 may include for example golden fingers, which, when the improved memory module structure 10 according to the present invention is inserted into the host system of the electronic device, are brought into connection with the host system.

Figure 3:
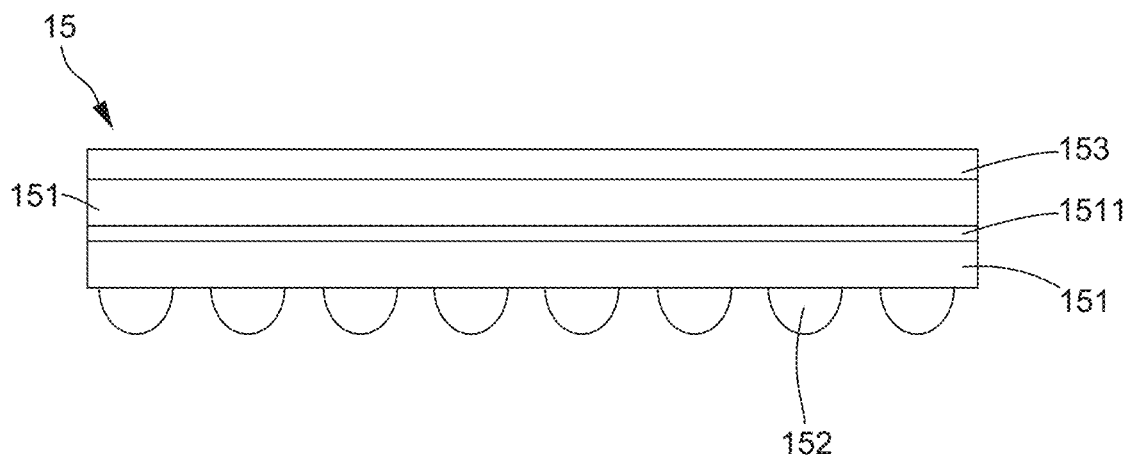
FIG. 3 is a schematic cross-sectional view showing a first example of a conduction element of a modification structure for the memory module shown in FIG. 2.
Figure 4:
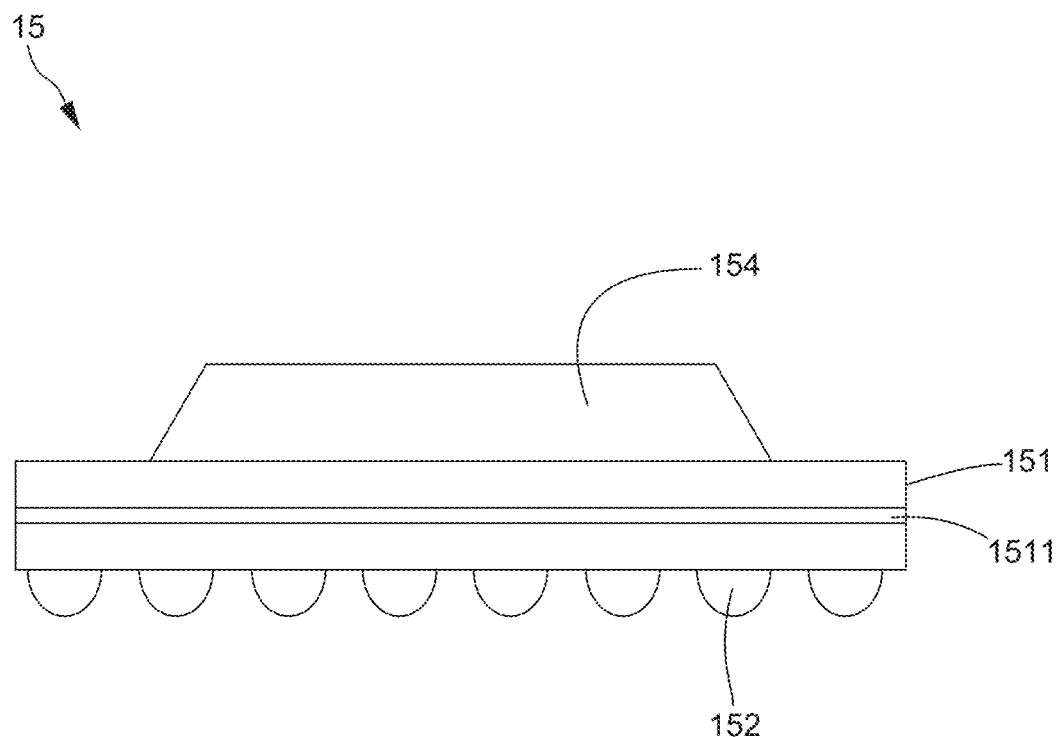
FIG. 4 is a schematic cross-sectional view showing a second example of the conduction element of the modification structure for the memory module shown in FIG. 2.
Figure 5:
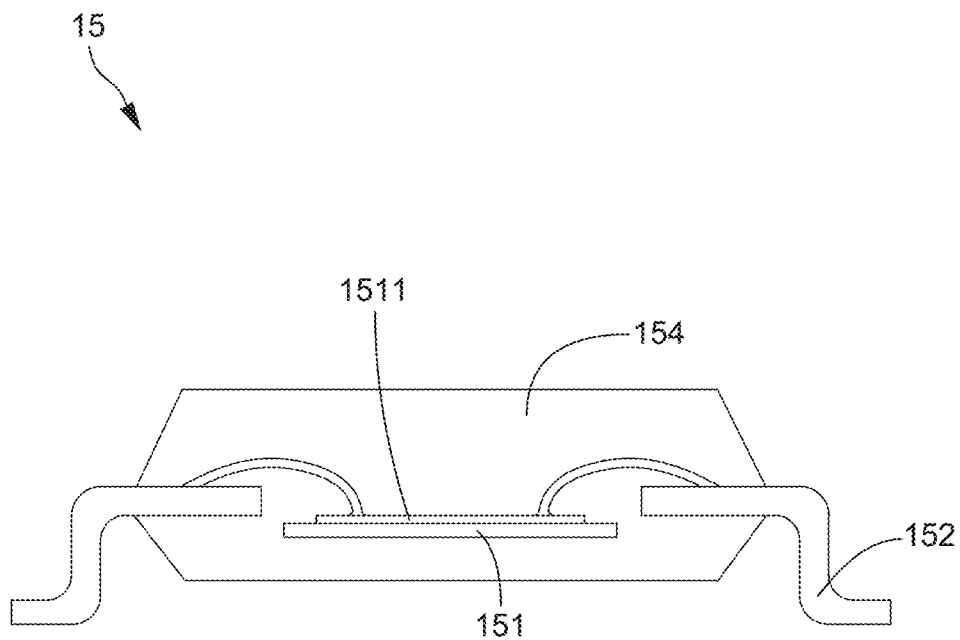
FIG. 5 is a schematic cross-sectional view showing a third example of the conduction element of the modification structure for the memory module shown in FIG. 2.

However, as shown in FIGS. 3-5, the conduction element 15 comprises a substrate 151 on which a conduction wiring layer 1511 is formed. The substrate 151 has an undersurface on which a plurality of connection members 152 are formed to correspond to the solder pads, so that the conduction element 15 is combinable with the printed circuit board 11 to have the solder pads 141 electrically connected. For example, the connection members 152 can be arranged as connection members of one of a ball grid array (BGA) (see FIGS. 4 and 5), a pin grid array (PGA), and a land grid array (LGA), and packaging of the conduction element 15 may include a BGA series package as shown in FIG. 4 and may alternatively include a small outline package (SOP) series package as shown in FIG. 5, or other packages, such as small outline J-lead (SOJ) series package, plastic leaded chip carrier (PLCC) series package, plastic quad flat package (PQFP) series, and quad flat non-lead (QFN) series package, those being not shown. Further, an ink layer 153 may be coated on a surface of the substrate 151 to protect the surface of the substrate 151 that is exposed.

In one embodiment, the conduction element 15 may have an outside configuration that corresponds to a register 23 of a register-included dual inline memory module 20, for easy installation by a manufacturer, and the conduction element 13 can be an electrical connector, an electrical switch, or an electrical relay. In addition, the conduction element 15 may include an encapsulation layer 154 (such as resin) arranged on top of the substrate 151, and the substrate 151 and the encapsulation layer 154 are provided with no chip therebetween, or the substrate 151 and the encapsulation layer 154 are provided with a chip therebetween but the chip provides no function at all. In this way, without the need to upgrade the functionality and performance of electronic equipment and product, the conduction element 15 is combinable with the printed circuit board 11 to have the solder pads 141 electrically connected so as to achieve an effect of electrical conduction. Thus, even there is no chip included, the transmission of electrical signals is still made possible to thereby achieve an effect of reducing cost. Alternatively, the substrate 151 of the conduction element 15 is provided with a heat dissipation device (not shown) or at least one passive element (not shown) to help improve the performance of the conduction element 15. The passive element can be an electrical resistor, an electrical capacitor, or an electrical inductor.

Figure 6:
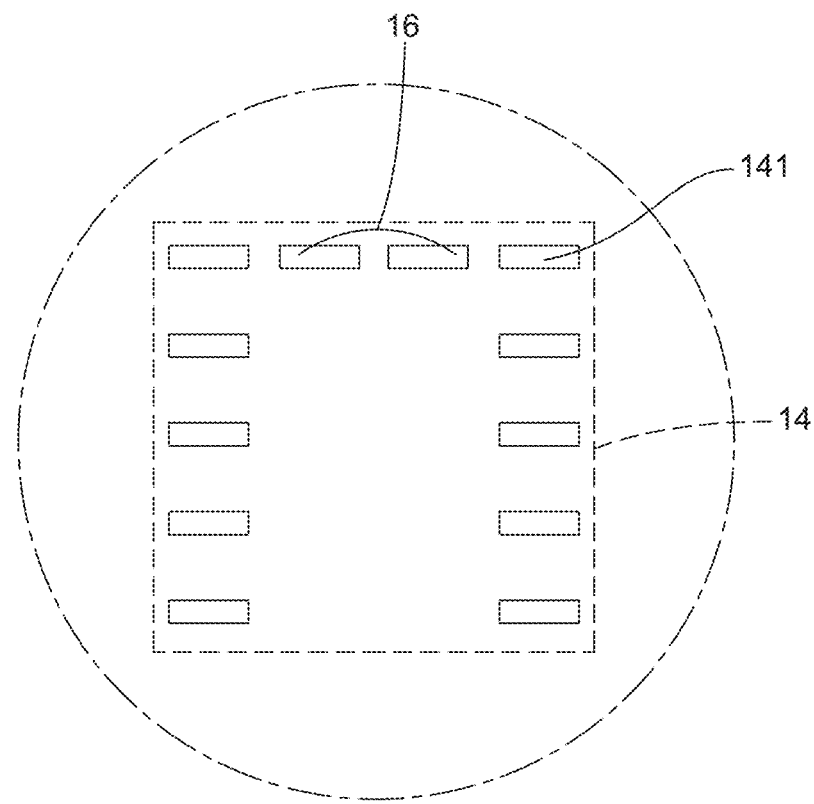
FIG. 6 is an enlarged view of a portion of FIG. 1.
Figure 7:
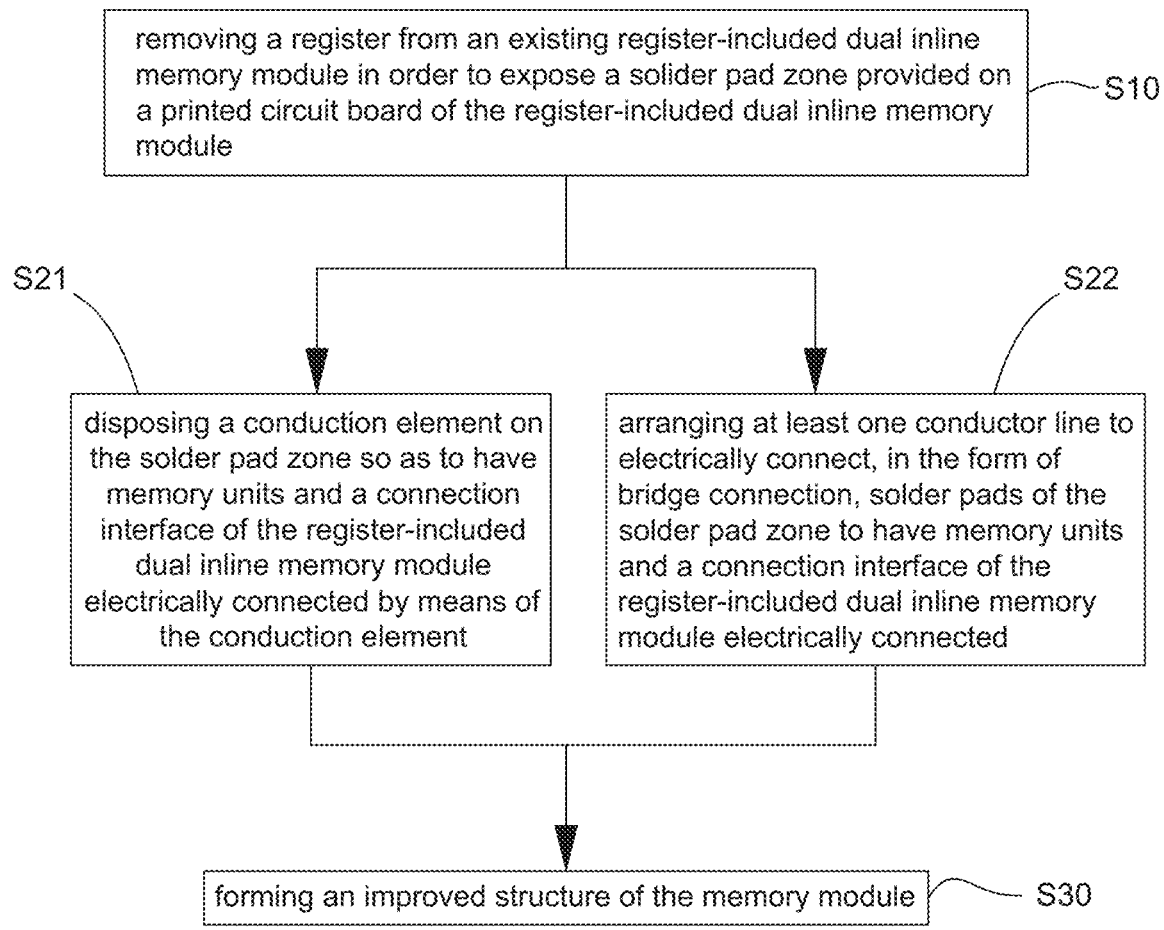
FIG. 7 is a flow chart showing a modification method of a memory module according to the present invention.
Figure 8:
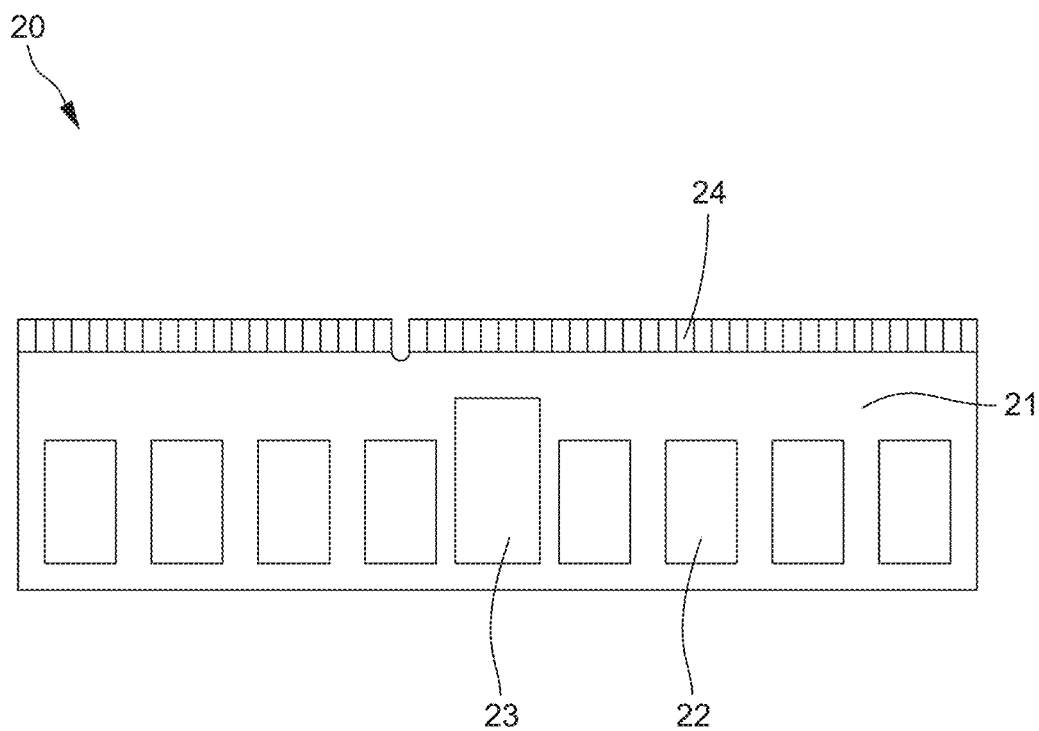
FIG. 8 is a plan view showing a known dual inline memory module having a register.

Further, referring simultaneously to FIGS. 1 and 6, the present invention provides another improved memory module structure 10, which comprises: a printed circuit board 11; a plurality of memory units 12, the memory units 12 being disposed on the printed circuit board 11; and a connection interface 13, which is disposed on the printed circuit board 11 for connection with a host system of an electronic device (not shown). The printed circuit board 11 is provided with a solder pad zone 14 that is in electrical connection with the memory units 12 and the connection interface 13. The solder pad zone 14 includes a plurality of solder pads 141. The solder pads 141 are electrically connected, in a form of bridge connection, by means of at least one conductor line 16. As such, the memory units 12 and the connection interface 13 are disposed on the printed circuit board 11 may also be electrically connected.

Preferably, the conductor line 16 is covered by an encapsulation layer (not shown) in order to protect the conductor line 16.

However, for any one of the examples of embodiment provided above, the solder pad zone 14 is provided as a solder pad zone that involves a register, and the solder pads 141 of the solder pad zone 14 may comprise at least one group of address signal terminals, the group of address signal terminals being electrically connected with each other. In this way, when there is a surplus supply of a dual inline memory module (RDIMM), a fully buffered dual inline memory module (FBDIMM), or a load reduced dual inline memory module (LRDIMM) that includes a register, the manufacturer or a distributor may, after removing the register, or a buffer, or an isolation memory buffer (IMB), make electrical connection among the exposed solder pads 141 of the solder pad zone 14. As such, the operation and time that the manufacturer or distributor necessarily take to modify and convert a register-included dual inline memory module into the present invention can be saved, and also, there is no need to provide an additional, new printed circuit board and to dispose of an existing printed circuit board of the register-included dual inline memory module. Thus, the present invention may achieve the same performance or effectiveness as the unbuffered dual inline memory module (UDIMM).

Finally, referring simultaneously to FIGS. 1-8, the present invention further provides a memory module modification method, which is applicable to modify and covert a dual inline memory module 20 that includes a register into an improved memory module structure 10. The method comprises: Step S10, in which a register-included dual inline memory module 20 is processed to remove a register included therein so that a solder pad zone (not shown) of a printed circuit board 21 of the register-included dual inline memory module 20 is uncovered and exposed; Step S21, in which a conduction element 15 is disposed on the solder pad zone, so that memory units 22 and a connection interface 24 of the register-included dual inline memory module 20 are electrically connected by means the conduction element 15, and an improved memory module structure 10 is thus formed as indicated in Step S30. Further, after the improved memory module structure 10 has been so formed, an ink layer 153 is additionally coated on substrate 151 of the conduction element 15, or alternatively, an encapsulation layer 154 is arranged to cover the substrate 151 of the conduction element 15.

When the conduction element 15 is disposed or positioned on the printed circuit board 21 of the register-included dual inline memory module 20, various ways, such as wire twisting and entangling, or soldering, may be applied to have the conduction element 15 combined with the printed circuit board 21 and in electrical connection with the memory units 22 and the connection interface 24.

In addition, the present invention further provides a memory module modification method, which is applicable to modify and covert a dual inline memory module 20 that includes a register into an improved memory module structure 10. The method comprises: Step S10, in which a register-included dual inline memory module 20 is processed to remove a register included therein so that a solder pad zone (not shown) of a printed circuit board 21 of the register-included dual inline memory module 20 is uncovered and exposed; Step S22, in which at least one conductor line 16 is applied to electrically connect, in the form of bridge connection, solder pads of the solder pad zone so as to have memory units 22 and a connection interface 24 of the register-included dual inline memory module 20 electrically connected to thus form an improved memory module structure 10 as indicated in Step S30.

Further, after the improved memory module structure 10 has been so formed, an encapsulation layer is further applied to cover the conductor line 16.

As such, the present invention is such that a conductor line 16 or a conduction element 15 is utilized to have the memory units 22 and the connection interface 24 electrically connected. In this way, the operation and time that a manufacturer or a distributor necessarily take to modify and convert a register-included dual inline memory module 20 into the improved memory module structure 10 can be saved, and also, there is no need to provide an additional, new printed circuit board and to dispose of an existing printed circuit board of the register-included dual inline memory module, the helping reduces waste of resources.

Conclusively, the present invention provides an improved memory module structure and a memory module modification method, which help alleviate or overcome the shortcomings of the prior art by using a conduction element or a conductor line to have solder pads electrically connected to thereby electrically connect the memory units and the connection interface, and thus, the operation and time that a manufacturer or a distributor must take to modify and convert a register-included dual inline memory module into the improved memory module structure can be saved, and there is no need to provide an additional, new printed circuit board and to dispose of an existing printed circuit board of the register-included dual inline memory module thereby helping eliminate waste of resources.

The above description is provided only for some preferred embodiments of the present invention and should not be construed to limit the scope of the embodiment of the present invention. Equivalent variations and modifications that can be readily achieved based on the claims and the disclosure of the present invention are considered falling in the scope defined by the claims of the present invention.

What is claimed is:

1. An improved memory module structure, comprising: a printed circuit board; a plurality of memory units, the memory units being disposed on the printed circuit board; and a connection interface, which is disposed on the printed circuit board for connection with a host system of an electronic device; wherein the printed circuit board comprises a solder pad zone that is in electrical connection with the memory units and the connection interface, and the solder pad zone comprises a plurality of solder pads, wherein a conduction element is combined with the solder pad zone, such that the solder pads are electrically connected by means of the conduction element, wherein the conduction element comprises a substrate on which a conduction wiring layer is formed, and the substrate has an undersurface on which a plurality of connection members are provided and respectively corresponding to the solder pads, and wherein the conduction element comprises an encapsulation layer arranged on top of the substrate, such that the substrate is located between the encapsulation layer and the plurality of connection members.

2. The improved memory module structure according to claim 1, wherein the substrate and the encapsulation layer are not provided with a chip therebetween.

3. The improved memory module structure according to claim 1, wherein the substrate and the encapsulation layer are provided with a chip therebetween, and the chip is of no function at all.

4. The improved memory module structure according to claim 1, wherein a heat dissipation device is arranged on the substrate of the conduction element.

5. The improved memory module structure according to claim 1, wherein at least one passive element is arranged on the substrate of the conduction element.

6. The improved memory module structure according to claim 5, wherein the passive element comprises an electrical resistor, an electrical capacitor, or an electrical inductor.

7. The improved memory module structure according to claim 1, wherein the conduction element comprises an electrical connector, an electrical switch, or an electrical relay.

8. An improved memory module structure, comprising: a printed circuit board; a plurality of memory units, the memory units being disposed on the printed circuit board; and a connection interface, which is disposed on the printed circuit board for connection with a host system of an electronic device; wherein the printed circuit board comprises a solder pad zone that is in electrical connection with the memory units and the connection interface, and the solder pad zone comprises a plurality of solder pads, and wherein at least one conductor line is arranged to electrically connect, in the form of bridge connection, the solder pads, wherein the conductor line is covered with an encapsulation layer.

9. A memory module modification method, which is applicable to modify and convert a register-included dual inline memory module into an improved memory module structure, the method comprising: removing a register from the register-included dual inline memory module in order to expose a solder pad zone provided on a printed circuit board of the register-included dual inline memory module, disposing of a conduction element on the solder pad zone so as to have memory units and a connection interface of the register-included dual inline memory module electrically connected by means of the conduction element to form the improved memory module structure, wherein the conduction element comprises a substrate on which a conduction wiring layer is formed, and the substrate has an undersurface on which a plurality of connection members are provided and respectively corresponding to the solder pads, and wherein the conduction element comprises an encapsulation layer arranged on top of the substrate, such that the substrate is located between the encapsulation layer and the plurality of connection members.

10. A memory module modification method, which is applicable to modify and convert a register-included dual inline memory module into an improved memory module structure, the method comprising: removing a register from the register-included dual inline memory module in order to expose a solder pad zone provided on a printed circuit board of the register-included dual inline memory module, arranging at least one conductor line to electrically connect, in the form of bridge connection, solder pads of the solder pad zone to have memory units and a connection interface of the register-included dual inline memory module electrically connected to form the improved memory module structure, wherein after the formation of the improved memory module structure, an encapsulation layer is set to cover the conductor line.

* * * * *